United States Patent
Lee et al.

(10) Patent No.: US 11,617,269 B2
(45) Date of Patent: Mar. 28, 2023

(54) CURRENT MEASURING DEVICE FOR AN ELECTRIC POWER PROTECTION SYSTEM

(71) Applicant: Schweitzer Engineering Laboratories, Inc., Pullman, WA (US)

(72) Inventors: Brent R. Lee, Pullman, WA (US); Veselin Skendzic, Schwenksville, PA (US); Arkanatha Sastry, Pullman, WA (US); Robert Lopez, Jr., Palouse, WA (US); Jeevan Jalli, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 141 days.

(21) Appl. No.: 17/380,145

(22) Filed: Jul. 20, 2021

(65) Prior Publication Data
US 2023/0024511 A1    Jan. 26, 2023

(51) Int. Cl.
| | | |
|---|---|---|
| *H05K 1/18* | (2006.01) | |
| *H05K 1/02* | (2006.01) | |
| *G01R 19/00* | (2006.01) | |

(52) U.S. Cl.
CPC ......... *H05K 1/189* (2013.01); *G01R 19/0092* (2013.01); *H05K 1/023* (2013.01); *H05K 2201/10151* (2013.01)

(58) Field of Classification Search
CPC .......... H05K 1/189; H05K 1/023; H05K 1/18; H05K 2201/10151; G01R 19/0092
USPC .......................................... 361/749
See application file for complete search history.

(56) References Cited

U.S. PATENT DOCUMENTS

| | | |
|---|---|---|
| 1,942,575 A | 1/1934 | Shapiro |
| 2,599,550 A | 6/1952 | Fraser |
| 2,845,562 A | 7/1958 | Bendell |
| 3,203,077 A | 8/1965 | Zimmerle |
| 3,684,955 A | 8/1972 | Adams |
| 3,942,029 A | 3/1976 | Kawakami |
| 4,616,176 A | 10/1986 | Mercure |
| 4,700,131 A | 10/1987 | Miller |
| 4,709,205 A | 11/1987 | Baurand |
| 4,799,005 A | 1/1989 | Fernandes |
| 4,803,425 A | 2/1989 | Swanberg |
| 4,808,959 A | 2/1989 | Weissman |
| 4,810,954 A | 3/1989 | Fam |
| 4,831,327 A | 5/1989 | Chenier |
| 4,899,246 A | 2/1990 | Tripodi |
| 5,012,218 A | 4/1991 | Haug |
| 5,055,816 A | 10/1991 | Altman |

(Continued)

OTHER PUBLICATIONS

Hain, Stefan; Bakran, Mark-M: "New Rogowski Coil Design with a High dV/dt Immunity and High Bandwidth" University of Bayreuth, Department of Mechatronics, Sep. 2-6, 2013.

(Continued)

*Primary Examiner* — Tremesha S Willis
(74) *Attorney, Agent, or Firm* — Richard M. Edge

(57) ABSTRACT

Current measurement devices for printed circuit board mounting are disclosed herein. The current measurement devices include a hollow and flexible core to improve response to a primary signal and decrease weight. The current measurement device includes a housing with guides to maintain alignment of the core. An electromagnetic shield may be placed between the circumference of the core and the housing. The housing may include apertures to facilitate washing. The current measurement device may include a primary conductor external to the housing.

20 Claims, 11 Drawing Sheets

(56) References Cited

U.S. PATENT DOCUMENTS

| | | |
|---|---|---|
| 5,066,904 A | 11/1991 | Bullock |
| 5,223,790 A | 6/1993 | Baran |
| 5,233,324 A | 8/1993 | Beihoff |
| 5,272,460 A | 12/1993 | Baumgartner |
| 5,414,400 A | 5/1995 | Gris |
| 5,442,280 A | 8/1995 | Baudart |
| 5,461,299 A | 10/1995 | Bruni |
| 5,461,309 A | 10/1995 | Baudart |
| 5,627,475 A | 5/1997 | Strosser |
| 5,808,846 A | 9/1998 | Holce |
| 5,831,506 A | 11/1998 | Crepel |
| 5,852,395 A | 12/1998 | Bosco |
| 5,917,316 A | 6/1999 | Bosco |
| 5,982,265 A | 11/1999 | Von Skarczinski |
| 6,008,711 A | 12/1999 | Bolam |
| 6,094,044 A | 7/2000 | Kustera |
| 6,137,394 A | 10/2000 | Holmes |
| 6,184,672 B1 | 2/2001 | Berkcan |
| 6,215,296 B1 | 4/2001 | Amoux |
| 6,255,565 B1 | 7/2001 | Tamura |
| 6,288,625 B1 | 9/2001 | Kaczkowski |
| 6,300,857 B1 | 10/2001 | Herwig |
| 6,313,623 B1 | 11/2001 | Kojovic |
| 6,351,114 B1 | 2/2002 | Iwasaki |
| 6,366,076 B1 | 4/2002 | Karrer |
| 6,369,687 B1 | 4/2002 | Akita |
| 6,380,727 B1 | 4/2002 | Jitaru |
| 6,420,952 B1 | 7/2002 | Redilla |
| 6,437,555 B1 | 8/2002 | Pioch |
| 6,566,854 B1 | 5/2003 | Hagmann |
| 6,614,218 B1 | 9/2003 | Ray |
| 6,624,624 B1 | 9/2003 | Karrer |
| 6,680,608 B2 | 1/2004 | Kojovic |
| 6,731,193 B2 | 5/2004 | Meier |
| 6,822,547 B2 | 11/2004 | Saito |
| 6,825,650 B1 | 11/2004 | McCormack |
| 6,940,702 B2 | 9/2005 | Kojovic |
| 6,958,673 B2 | 10/2005 | Suzuki |
| 6,965,225 B2 | 11/2005 | De Buda |
| 7,009,486 B1 | 3/2006 | Goeke |
| 7,078,888 B2 | 7/2006 | Budillon |
| 7,106,162 B2 | 9/2006 | Saito |
| 7,109,838 B2 | 9/2006 | Brennan |
| 7,227,441 B2 | 6/2007 | Skendzic |
| 7,227,442 B2 | 6/2007 | Skendzic |
| 7,474,192 B2 | 1/2009 | Skendzic |
| 7,545,138 B2 | 6/2009 | Wilkerson |
| 7,733,208 B2 | 6/2010 | Wolfgram |
| 7,825,763 B2 | 11/2010 | Dupraz |
| 7,902,812 B2 | 3/2011 | Kojovic |
| 8,928,337 B2 | 1/2015 | Kesler |
| 10,545,178 B2 | 1/2020 | Kern |
| 2003/0090356 A1 | 5/2003 | Saito |
| 2004/0008461 A1 | 1/2004 | Kojovoc |
| 2004/0012901 A1 | 1/2004 | Kojovoc |
| 2004/0178875 A1 | 9/2004 | Saito |
| 2005/0052268 A1 | 3/2005 | Pleskach |
| 2005/0156587 A1 | 7/2005 | Yakymyshyn |
| 2005/0156703 A1 | 7/2005 | Twaalfhoven |
| 2005/0248430 A1 | 11/2005 | Dupraz |
| 2006/0066425 A1 | 3/2006 | Gruner |
| 2006/0174834 A1 | 8/2006 | Long |
| 2006/0176140 A1 | 8/2006 | Skendzic |
| 2006/0232263 A1 | 10/2006 | Kovanko |
| 2006/0232265 A1 | 10/2006 | Fritsch |
| 2007/0199176 A1 | 8/2007 | McClellan |
| 2008/0048646 A1 | 2/2008 | Wilkerson |
| 2008/0252409 A1 | 10/2008 | Kojima |
| 2011/0025304 A1 | 2/2011 | Lint |
| 2011/0025305 A1 | 2/2011 | Lint |
| 2011/0148561 A1 | 6/2011 | Lint |
| 2015/0008903 A1 | 1/2015 | Javora |
| 2018/0364315 A1 | 12/2018 | Huang |

OTHER PUBLICATIONS

Draxler, Karel; Styblikova, Renata: "Magnetic Shielding of Rogowski Coils" Mar. 19, 2018.

CURRENT MEASURING DEVICE FOR AN ELECTRIC POWER PROTECTION SYSTEM

RELATED APPLICATION (none)

TECHNICAL FIELD

This disclosure relates to a current measuring device for an electric power protection system. More particularly, this disclosure relates to current measuring devices for mounting on a printed circuit board with decreased weight and improved electrical response to a primary signal.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
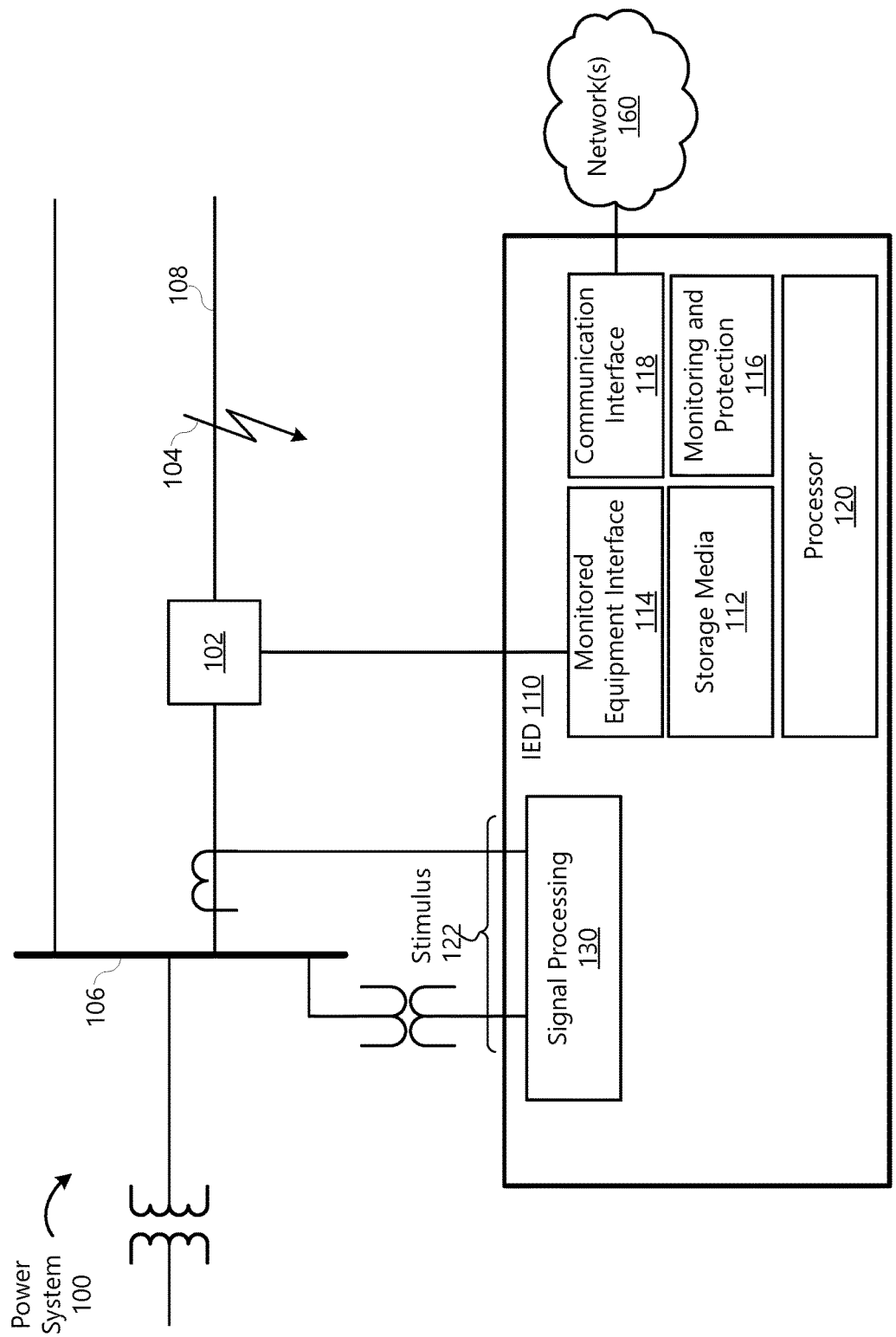
FIG. 1 illustrates a one-line diagram of an electrical power delivery system comprising a protection system that may include a current measuring device in accordance with several embodiments herein.

Electric power delivery systems are typically monitored and protected by intelligent electronic devices ("IEDs") that obtain voltage and current measurements from the power system. IEDs use those measurements to determine a condition of the power system and effect a protective action (such as signaling a circuit breaker to trip) under certain determined conditions. The IEDs may obtain current signals, voltage signals, status signals, electromagnetic radiation (light) signals, and the like to determine the status of the electric power delivery system. That is, instrument transformers such as high-voltage current transformers may reduce the primary currents to a more manageable "secondary level" which is typically in the range of 1 A to around 5 A. These "secondary level" currents are then monitored by the IED, using a variety of galvanically isolated current sensors such as, for example, auxiliary CTs, Hall effect sensors, isolated resistor shunts, and the like. The IED may use the outputs of the current sensors to determine an overcurrent condition, undervoltage condition, frequency deviation, arc flash, or the like. Many of these conditions depend upon a proper measurement of current signals obtained from the electric power delivery system.

Typical current sensors used in IEDs have a limited dynamic range. Accurate current measurements are limited by this dynamic range. That is, currents outside of the limited range cannot be accurately measured using the device. Indeed, these limitations are further exposed when the IED uses newer A/D converters, which may include a dynamic range exceeding 120 dB (20+ bits).

Typical current measurement devices inside electric power system protection devices may consist of a current transformer with a primary winding, a core, and a secondary winding to step down a higher-current from the electric power delivery system to a lower current that may be used by the components of the protection device. Typical current measurement devices have several drawbacks. For example, the transformer core may saturate during a high-current event, yielding corrupt waveform measurements to the protection device. Typical current transformers may be rated for use in a range of currents, voltages, and frequencies, and may not be capable of providing useful signals outside of those rated ranges. Further still, typical current transformers may not provide linear responses except in a range of expected currents. Of course, under an overcurrent condition (when protection is needed), the current transformer may enter its non-linear region and produce corrupt signals to the protection device. What is needed is a current measuring device for use in electric power system protective devices capable of providing useful signals even under overcurrent conditions.

Furthermore, typical current transformers are costly to manufacture, heavy, and require the use of excess materials. Current transformers that include a toroidal core or a core in a closed structure require special equipment to apply windings to the core. Furthermore, typical cores are formed of iron or steel, often in the form of layers of laminated iron or steel. The core adds substantially to the mass of the current transformer, which adds to the cost of the part as well as the weight of the protection device. Some protection devices measure current from several sources (a current transformer for each phase of a three-phase system), and require several current transformers to be placed on one or more printed circuit boards. Multiple current transformers not only take up valuable space on the circuit board but also add significant weight. What is needed is a current measuring device that simplifies manufacturing thereof and reduces mass and material usage.

In some devices, a Rogowski coil may be used as a current measuring device. While a Rogowski coil does not require an iron core, wound Rogowski coils have proven difficult to manufacture and use due to required winding equipment, sensitivity to coil placement and spacing, sensitivity to the placement of the conductor carrying the measured current, sensitivity to external currents, and process reproducibility. What is needed is a current measurement mechanism that resolves sensitivity issues and facilitates a repeatable manufacturing process.

Provided herein are embodiments of current measuring devices for use in electric power system protection devices. Embodiments of the current measuring devices described herein provide useful electrical signals across a broad range of input currents to be measured. Indeed, current measurement devices disclosed herein may be accurate to current levels in excess of around 300 A while allowing back-end electronics (such as A/D converters) to measure milliamp-level signals from the current measurement device. Embodiments of the current measuring devices described herein include features that reduce sensitivity to outside influences and facilitate repeatable manufacturing processes.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

FIG. 1 illustrates a one-line diagram of an electric power delivery system 100 monitored by an IED 110 that provides electric power system protection such as distance protection, overcurrent protection, arc flash protection, and the like. The electric power system 100 may include a bus 106 and feeders such as feeder 108 for delivering electric power. Feeder 108 is monitored by IED 110, which obtains current signals from the feeder 108 and voltage signals from the bus 106 using instrument transformers (such as a current transformer, potential transformer, or the like). The IED 110 may include a processor 120 for executing computer instructions, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like for storing computer instructions, measurements, settings, and the like. The IED 110 may be communicatively coupled to one or more networks 160 via one or more communication interfaces 118. The networks 160 may include special-purpose networks for monitoring and/or controlling the electrical power system 100 (e.g., SCADA networks, or the like). The networks 160 may further include general purpose communication networks, such as a TCP/IP network, or the like. The communication interface 118 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

The IED 110 may include a plurality of monitoring and protection elements, which may be described as a monitoring and protection module 116 that may be embodied as instructions stored on computer-readable media (such as storage media 112). The instructions, when executed on the processor 120, cause the IED to detect a power system condition such as fault 104. Upon detecting a fault, the instructions may cause the IED to take actions such as protective actions (signaling a circuit breaker to open the appropriate phases), displaying fault information, sending messages including the fault information, and the like. Methods disclosed herein may generally follow the instructions stored on media for distance protection. The monitoring and protection module 116 may include an overcurrent element, an arc-flash element, and the like.

The IED 110 may obtain electrical signals (the stimulus 122) from the power system 100 through instrument transformers. The stimulus 122 may include, but is not limited to: current measurement signals, voltage measurement signals, light measurement signals, equipment status (breaker open/closed), and the like.

The IED may include a signal processing module 130 to receive the electric power system signals and process the signals for monitoring and protection such as distance protection. The processing may include stepping down current and/or voltage signals using a current measurement mechanism such as are described herein. Further filtering of the stimulus may be performed using hardware and/or in digital processing. Currents and voltages may be sampled at a rate suitable for protection, such as on the order of kHz. An analog-to-digital converter (ADC) may create digital representations of the incoming line current and voltage measurements. The output of the ADC may be used in the various protection elements of the monitoring and protection module 116.

A monitored equipment interface 114 may be in electrical communication with monitored equipment such as circuit breaker 102. Circuit breaker 102 may be configured to selectively trip (open). The monitored equipment interface 114 may include hardware for providing a signal to the circuit breaker 102 to open and/or close in response to a command from the IED 110. For example, upon detection of a condition such as a fault 104, the monitoring and protection module 116 may determine a protective action and effect the protective action on the power system by, for example, signaling the monitored equipment interface 114 to provide an open signal to the appropriate circuit breaker 102. Upon detection of the fault 104 the IED 110 may signal other devices (using, for example, the network 160, or signaling another device directly by using inputs and outputs) regarding the fault, which other devices may signal a breaker to open, thus effecting the protective action on the electric power delivery system.

Several embodiments of the current measuring device described herein may be configured without a magnetic core and operate to measure current signals using principles similar to those by which Rogowski coils operate. Indeed, in various embodiments, the current measuring devices herein may be configured as Rogowski coils. The current measuring devices herein may have an air core or a core comprised of a non-magnetic or non-electrically-conductive material. The core may be wound with conductive windings in a first direction, and either include windings in the reverse direction or a lead from one end of the windings returning through the core. The wound core may be in the form of a toroid or similarly configured to encompass a conductor carrying the current to be measured. A voltage will be induced on the windings of the current measuring device that is proportional to a rate of change of the current to be measured. Accordingly, the output of the current measuring device may be integrated (e.g. digitally or using analog components) to provide a signal that is proportional to the current in the conductor. The particular aspects and configuration of current measuring devices described herein may overcome several of the stated deficiencies of previous current transformers.

Figure 2:
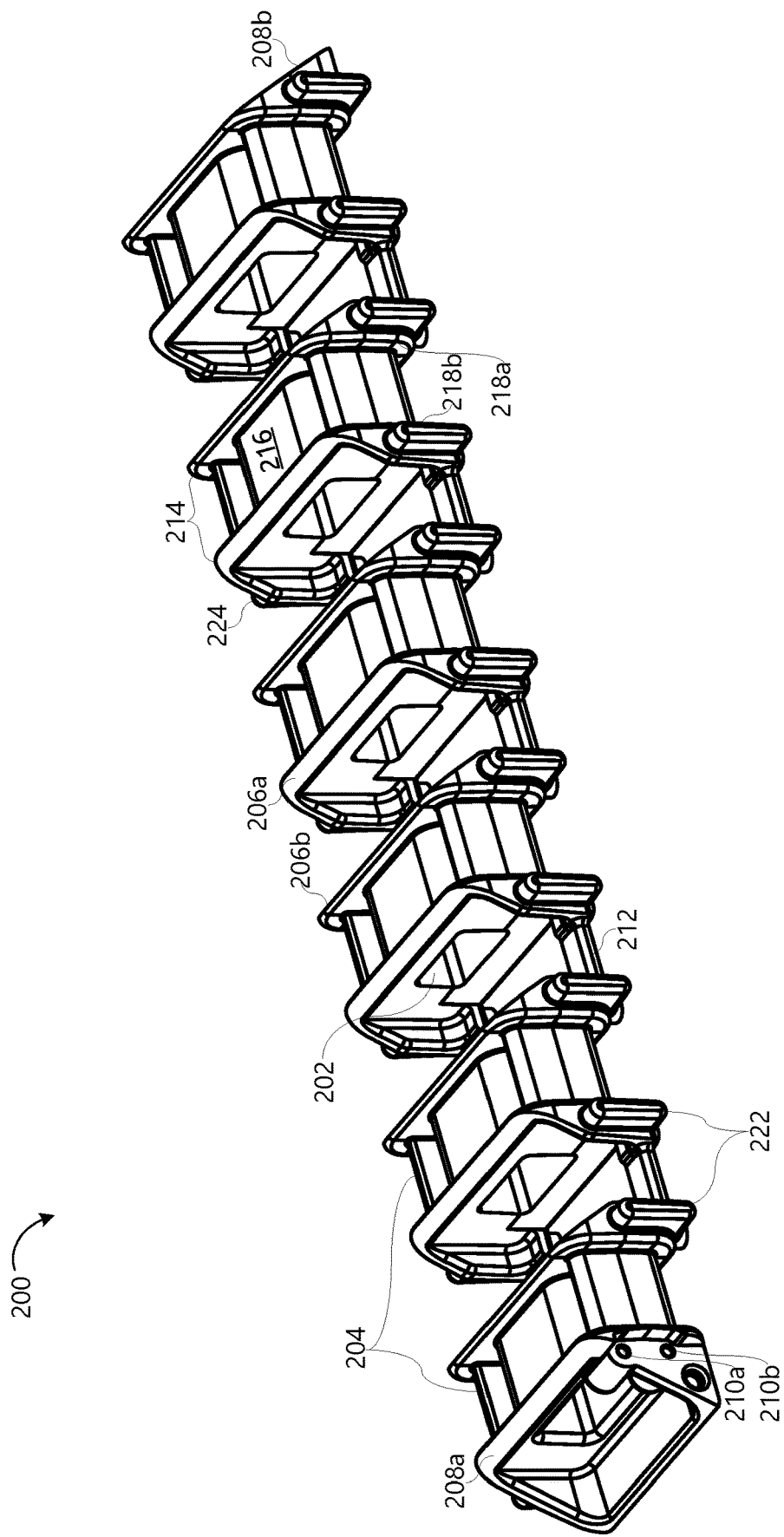
FIG. 2 illustrates a winding bobbin of a current measuring device in accordance with several embodiments herein.

FIG. 2 illustrates a core 200 for a current measuring device in accordance with several embodiments described herein. The core 200 is illustrated in a linear formation to facilitate winding. As has been indicated above, winding a closed-loop core may require sophisticated equipment. However, winding a linear bobbin or a bobbin in a linear configuration may be done with conventional winding equipment. The bobbin may be hollow 202. This reduces the mass of the current measuring device, and the materials required to manufacture the current measuring device. Furthermore, the hollow core 202 may facilitate placement of a spindle of the winding equipment. Accordingly, the empty bobbin 200 may be placed on a winding spindle, which spins the bobbin as it is wound with wire. Upon completion of the winding, the wound bobbin may be simply removed from the spindle.

The bobbin 200 may include a number of winding sections 204 separated by intermediate portions 212. In the illustrated embodiment, six winding sections 204 are illustrated. It is anticipated that a bobbin in accordance with the present disclosure may include more or fewer winding sections 204. The winding sections 204 may be separated by intermediate portions 212 and mating surfaces 206a, 206b. The intermediate portions 212 may be flexible to allow the bobbin to be arranged into a closed configuration (illustrated subsequently). The bobbin 200 may include opposing mating surfaces 208a, 208b at opposite ends of the bobbin 200. The opposing mating surfaces 208a and 208b may be arranged to be in contact upon the arrangement of the bobbin 200 in a closed configuration. The mating portions 206a, 206b, 208a, 208b, and the intermediate portions 212 may facilitate uniform distribution of the windings around the current measuring device when arranged in a closed configuration.

Figure 4B:
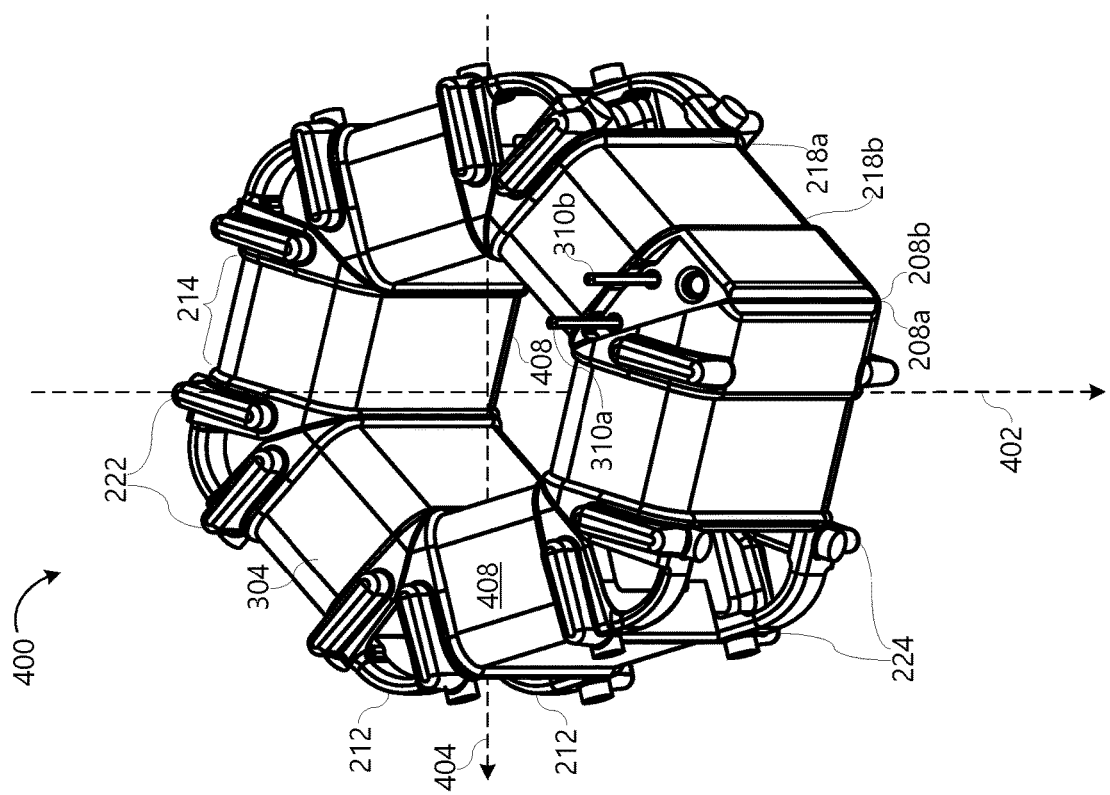
FIGS. 4A and 4B illustrate a configured bobbin of a current measuring device in accordance with several embodiments herein.
Figure 4A:
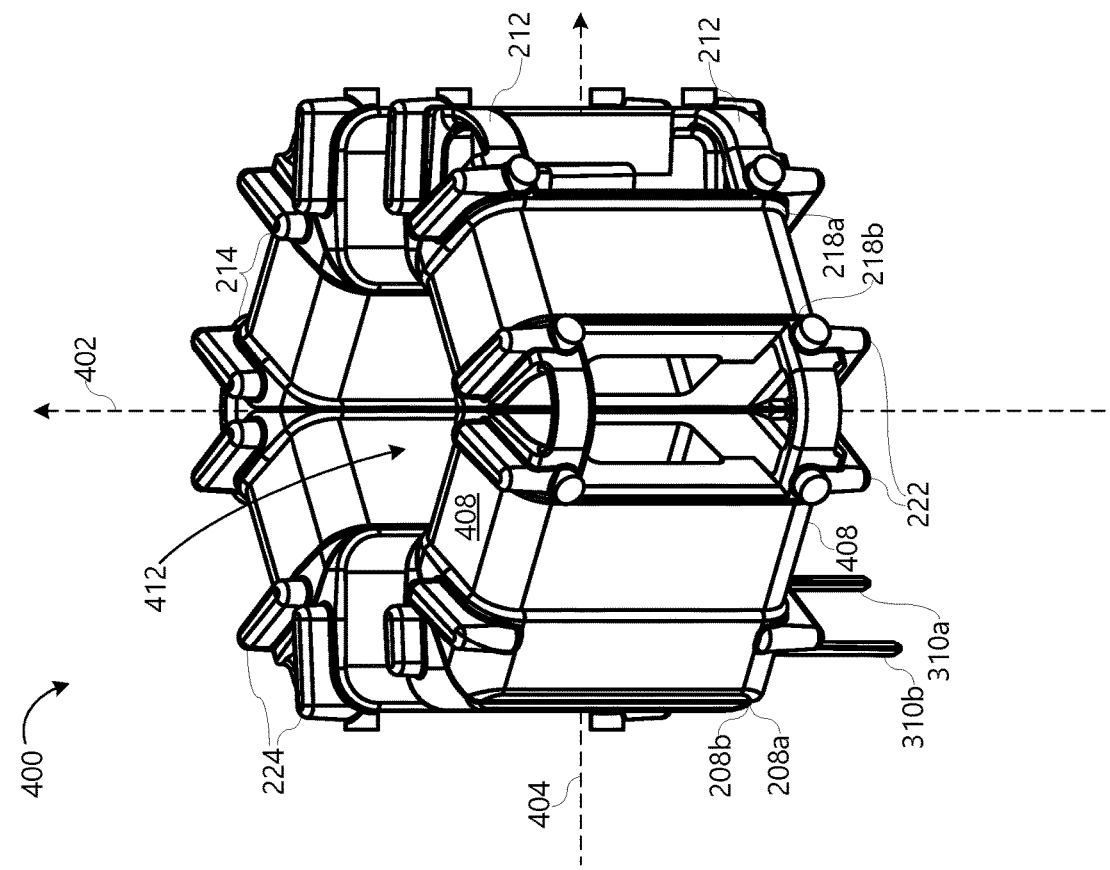

The bobbin 200 may be formed from an electrically insulating material capable of flexing or deformation from a linear configuration to a closed configuration (as illustrated in FIGS. 4A and 4B). The bobbin 200 may be formed from a polymer such as a polycarbonate resin. The bobbin 200 may be formed using an injection molding process, where the bobbin 200 is originally formed in a linear configuration and arranged in the closed configuration after windings are placed on the bobbin 200.

The winding sections 204 may be configured to facilitate the winding of the wire conductor thereon. To that end, each winding section 204 may include a winding surface 216 bounded by winding guide surfaces 218a, 218b. Accordingly, the winding space 214 between the winding guide surfaces 218a, 218b may be filled to a predetermined amount with conductive windings. In various embodiments, a single length of the coil may be wound around each of the winding sections 204 in turn. In various embodiments, separate lengths of the coil may be wound around each of the winding sections 204 and electrically connected to provide a single conductive winding. In various embodiments, the bobbin 200 may be wound first in a first direction and reversed to be wound in a second direction such that the first and second ends of the conductive winding terminate at the same winding section 204.

The bobbin 200 may include terminal apertures 210a, 210b to accept winding terminals. Each end of the winding may be attached to one of the winding terminals. The winding terminals may be used to obtain the measured signal from the windings. In various embodiments as described herein, the current measurement device may be configured for mounting on a printed circuit board, and the winding terminals may correspond with conductive pathways of the printed circuit board for electrical connection thereto. As described herein, the terminals aperture 210a, 210b may be disposed on an axial surface of the bobbin (as opposed to a radial surface) such that an axis of the configured bobbin 200 is substantially perpendicular to the plane of the printed circuit board when mounted on the printed circuit board. As will be described in more detail below, mounting of a current measuring device with the axis substantially perpendicular to the plane of the printed circuit board reduces the profile of the current measuring device from the printed circuit board, when compared to the mounting of the current measuring device with the axis substantially parallel with the plane of the printed circuit board. Decreasing a profile of a surface-mount device may increase the mechanical stability of the connection between the device and the printed circuit board.

As will be described in additional detail herein, the bobbin 200 may include a first and second plurality of alignment features 222, 224 to associate with corresponding alignment features of a housing. The alignment features 222, 224 may be configured as protrusions to mate with pockets or apertures in a housing. The alignment features 222, 224 may be disposed of on one or more surfaces of the bobbin. The alignment features 222, 224 may facilitate proper alignment of the bobbin within a housing. Proper alignment of a wound bobbin within the housing using the alignment features 222, 224 may reduce manufacturing variability between current sensing devices, and improve the accuracy of current measurements. Alignment features 222, 224 also increase the mechanical stability of a fully-assembled current measurement device.

Figure 3:
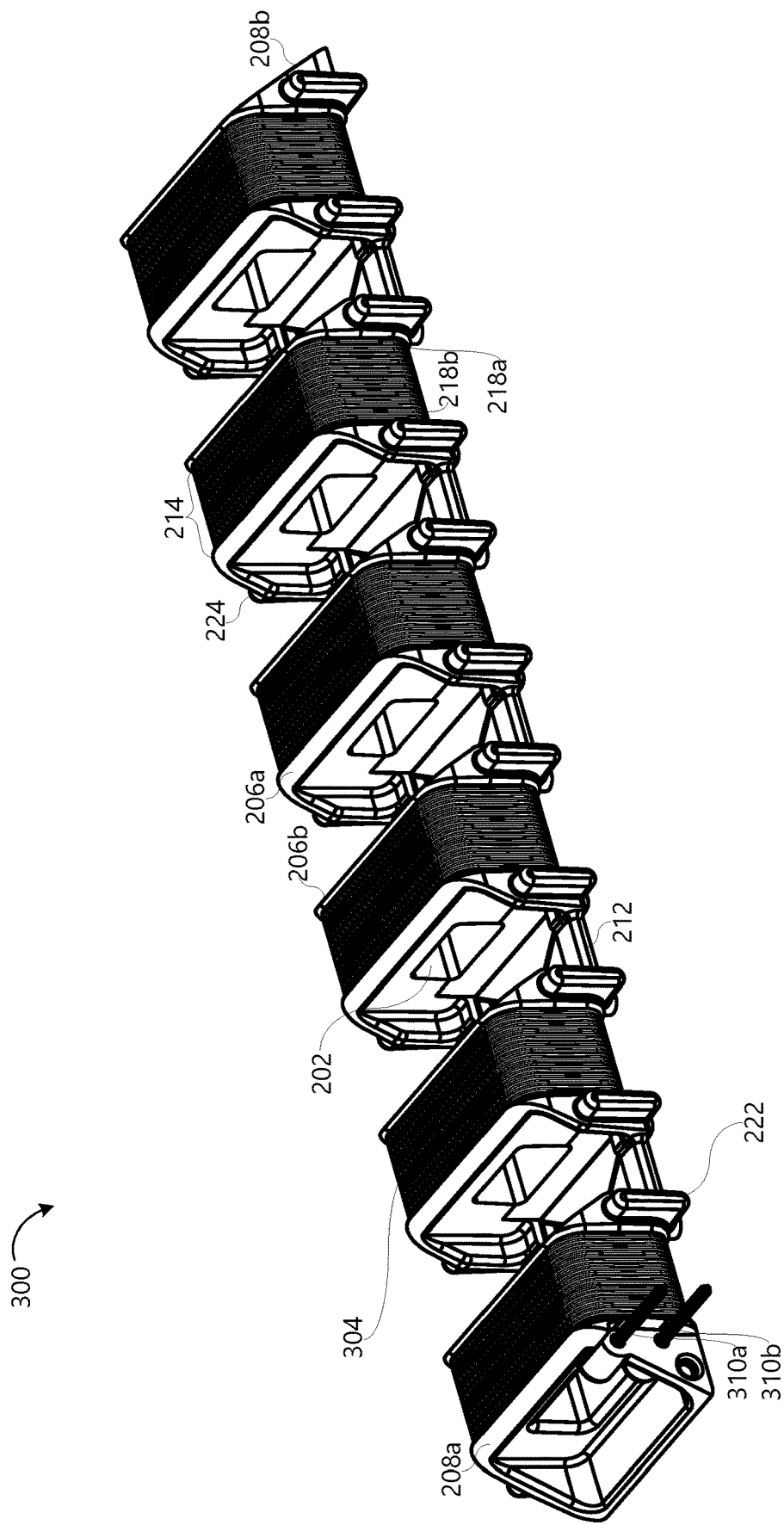
FIG. 3 illustrates a wound bobbin of a current measuring device in accordance with several embodiments herein.

FIG. 3 illustrates a perspective view of a wound bobbin 300. The wound bobbin may consist of a bobbin 200 with windings 304 applied to the winding sections 204. The winding may proceed between the winding guide surfaces 218a, 218b of each winding section 204. The windings may include one or more layers of windings and may include a forward winding and a reverse winding. The wound bobbin 300 may further include termination posts 310a, 310b inserted into the terminal apertures 210a, 210b and electrically connected to a first and second end of the winding material. The wound bobbin 300 may be configured to provide a single conductive path between a first termination post 310a, through the windings 304, and back to the second termination post 310b.

FIG. 4A illustrates a top perspective view of a wound bobbin 400 arranged in a closed configuration; while FIG. 4B illustrates a bottom perspective view of the wound bobbin 400 arranged in a closed configuration. In the closed configuration, the mating surfaces 208a and 208b are brought into contact such that mating surfaces 206a and 206b of each section 204 are brought into contact at an inner circumference while each intermediate portion 212 between the sections 204 is bowed to facilitate the arrangement along an outer circumference of the configured bobbin 400. The flexible intermediate portions 212 between the sections 204 allow for the arrangement of the bobbin into a closed configuration.

With the bobbin in closed configuration 400, the housing guides 222 and 224 can be seen and appreciated as extending in an axial direction of the configured bobbin. The axial direction may be considered as generally parallel with the axis of symmetry 402 of the configured bobbin 400. To that end, housing guides 222 and 224 may extend from axial faces 408 of the configured bobbin 400. Termination posts 310a, 310b may also extend from one of the axial faces 408 generally in an axial direction, perpendicular to the axial face 408. As illustrated, both termination posts 310a, 301b may extend from the same axial face 408 to facilitate mounting and electrical connection with traces on a printed circuit board.

With the bobbin in closed configuration 400, the bobbin is configured such that a conductor carrying the current to be measured may be extended through the opening 412 created by arranging the bobbin into a closed configuration. The opening 412 may encompass the axis of symmetry 402. In various embodiments, a primary conductor may extend through the opening 412 of the configured bobbin 400. Current on the primary conductor may induce an electrical signal in the windings 304 related to the current on the primary conductor.

Figure 5:
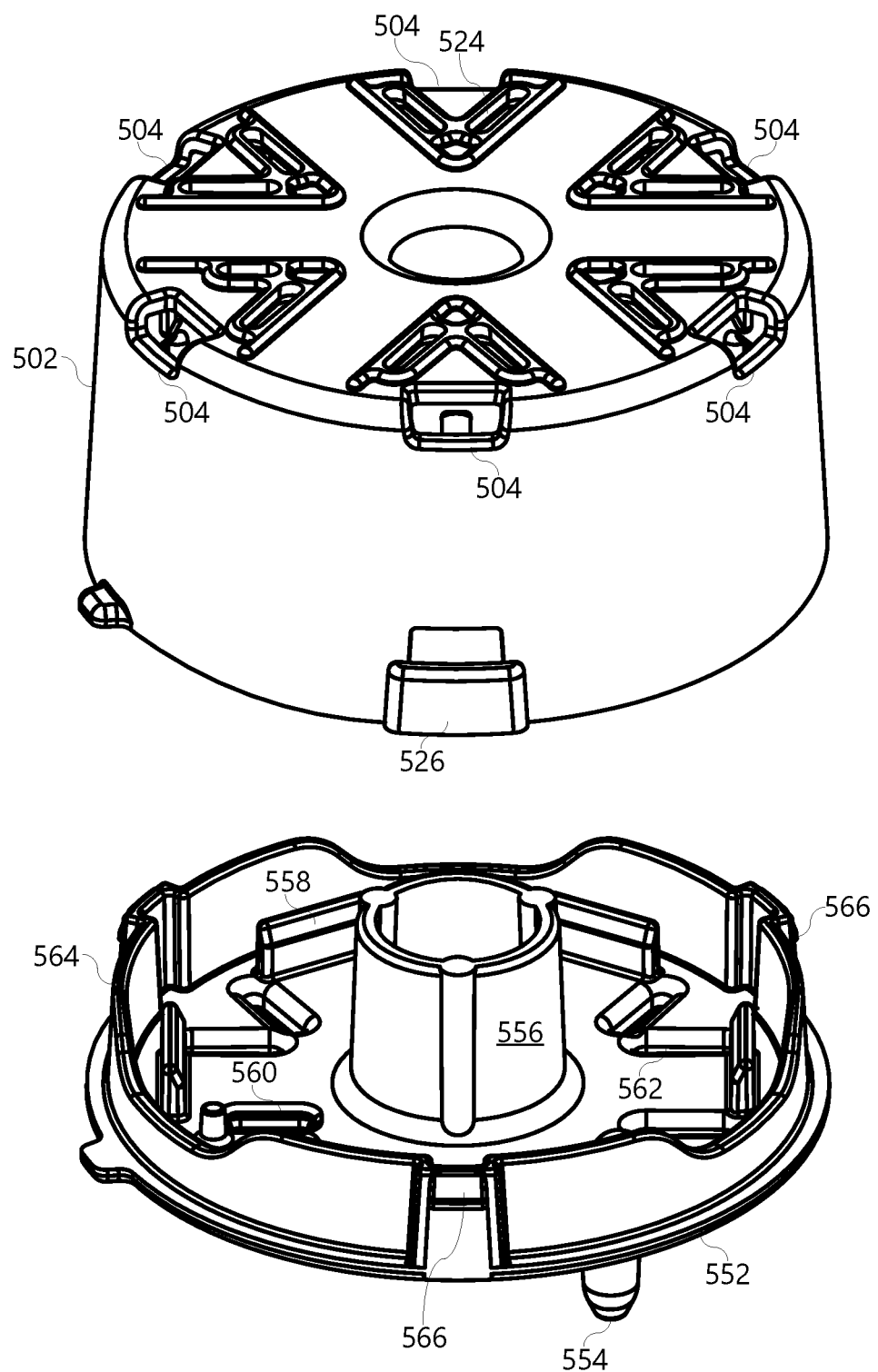
FIG. 5 illustrates a housing of a current measuring device in accordance with several embodiments herein.

FIG. 5 illustrates a perspective view of a housing for a bobbin of a current measuring device in accordance with several embodiments herein. The housing may be configured to contain and add mechanical strength and stability to the wound and configured bobbin 400. Accordingly, the housing may be configured or formed to hold the flexible core with the core in a closed configuration; or in embodiments where the flexible core includes features for maintaining the closed configuration, the housing may be configured or formed to contain the flexible core with the core in a closed configuration. This additional strength and stability may increase the measurement accuracy of the current measurement device by maintaining the relative position of the core to a primary conductor. The housing may facilitate mounting of the current measurement device on a printed circuit board, by inclusion of mounting features. Furthermore, the housing may facilitate handling of the current measurement device between the manufacturing thereof and the mounting of the current measurement device on the printed circuit board.

The housing may include a housing cup 502 and a housing base 552. The housing cup 502 and the housing base 552 may be separable, and have features for maintaining a position of the wound bobbin and other components of the current measurement device. The housing may be generally in the shape of a toroid to facilitate housing of the configured bobbin 400. The housing may include a hollow center to facilitate passage of a conductor carrying the current to be measured, encompassed by the configured bobbin 400.

The bobbin has been illustrated as including a number of housing guides 222, 224 that may be formed for cooperation with corresponding guide couplers. Accordingly, the housing cup 502 may include one or more guide couplers 524 for cooperation with one or more housing guides 224; and housing base 552 may include one or more guide couplers 562 for cooperation with one or more housing guides 222. As illustrated, the bobbin includes four housing guides 222, 224 on each winding section 204, including two on each opposing axial face. The housing cup 502 and housing base include a corresponding number of guide couplers 524, 562. In various embodiments, the guide couplers 524, 562 may be openings that allow portions of the housing guides 222, 224 to pass through, securely holding the housing guides in place. In other embodiments, the guide couplers 524, 562 may be formed as pockets or cups into which the housing guides 222, 224 are placed and held securely. Various combinations of openings and pockets may be used.

The housing base may include one or more terminal openings 560 to allow passage of the terminals 310a, 310b from the bobbin and through the housing base for contact with traces on the printed circuit board. As will be further illustrated hereinafter, upon insertion of the configured bobbin 400 into the housing and closing of the housing cup 502 and housing base 552, the housing guides 222, 224, and guide couplers 524, 562 cooperate to secure the position of the configured bobbin 400 within the housing. In various embodiments, the cooperation of the housing guides 222, 224 and housing couplers 524, 562 secure the relative position of the configured bobbin and the housing by resisting rotation of the configured bobbin within the housing. Rotation of the bobbin within the housing may cause stress on the terminals 310a, 310b, and/or may alter an electrical response of the current measurement device. Accordingly, the coordination of the housing guides 222, 224 and the guide couplers 524, 562 may improve the functioning and strength of the current measurement device.

The housing cup 502 may also include one or more drain windows 504. The drain windows 504 may be openings or gaps in the housing that allow for the passage of liquids through the cap. These windows 504 may be beneficial during the board washing process wherein the printed circuit board with mounted components are washed. Such washing may be performed to remove unwanted residue. Washing may be part of a conformal coating process. The windows 504 allow for the passage of the washing fluids out of the current measuring device during a drying phase of the washing process. Fluids trapped in components may reduce reliability by promoting corrosion, electrical shorting, and the like. The drain windows 504 improve the reliability of the current measuring devices described herein by allowing fluids to be removed from the current measuring device following the board washing process.

The housing cup may further include one or more fastening features such as the illustrated clip receiver 526 for holding the housing cup 502 to the housing base 552. The clip receiver 526 may be formed for receiving a locking protrusion of a deformable snap-fit securing clip 566 of the housing base 552. Although a cantilever-type snap-fit securing clip 566 and corresponding receiver 526 are illustrated, various other securing features may be used such as, for example, torsion snap joints, annular snap joints, threaded joints, or the like may be used to secure the housing cup 502 to the housing base 552.

The housing base 552 may include one or more securing clips 566 configured to mate with the clip receivers 526 of the housing cup 502. In the illustrated embodiment, the housing cup includes three clip receivers 526 positioned and configured for mating with the three securing clips 566 of the housing base 552. More or fewer securing clips 566 and corresponding clip receivers 526 may be used. Furthermore, the securing clips 566 and corresponding clip receivers 526 are illustrated as generally evenly spaced around the circumference of the housing base 552 and housing cup 502. In various embodiments, the pairs of securing clips 566 and corresponding clip receivers 526 may be unequally spaced around the circumference. Equal spacing may allow for connection at various relative rotational positions between the housing cup 502 and housing base 552, whereas unequal spacing of the pairs of securing clips and corresponding clip receivers 526 may result in a single possible relative rotational position between the housing cup 502 with the housing base 552.

The housing may include a central structure to allow passage of the conductor carrying the current to be measured. As illustrated, the central structure may be embodied as a conductor aperture 556 of the housing base 552. In various other embodiments, the central structure may form part of the housing cup 502 or a separate component. The conductor aperture 556 may coordinate an aperture in the housing cup 502 allowing for passage of the conductor. As illustrated, the conductor aperture 556 may be configured to conform with one or more features of the configured bobbin 400 such that a position of the configured bobbin 400 within the housing may be supported by the conductor aperture 556.

The housing base 552 and/or the housing cup 502 may include further support structures for maintaining placement of the bobbin and other components of the current measuring device. For example, the housing base 552 may include guides 558 for maintaining a position of the bobbin within the housing. The guides 558 may further maintain a position of an electromagnetic shield. As illustrated, the guides 558 may be positioned to coordinate with the winding sections 204 of the configured bobbin 400. As the winding sections 204 are substantially planar, and a magnetic shield may be circular, a space may be left between the planar sections of the windings 304 and the magnetic shield. Accordingly, the guides 558 may be configured to coordinate into such space.

To facilitate the connection between the housing cup 502 and the housing base 552, the housing base 552 may include a contacting surface 564 for coordinating with the housing cup 502. As illustrated, the contacting surface 564 is configured to contact an inner surface of the housing cup 502. In various other embodiments, the contacting surface 564 may be configured to contact an outer surface of the housing cup 502. The contacting surface 564 may coordinate with the housing cup by overlapping therewith. The contacting surface 564 may be formed with the securing clips 566. In other embodiments, the securing clips 566 may be formed separately from the contacting surface 564.

As will be described in more detail herein, the housing base 552 may include one or more features for coordination with the printed circuit board. The current measuring devices described herein include several features to improve mounting on a printed circuit board. In various embodiments, the current measuring device may include a plurality of alignment pegs 554 extending from the housing base. The alignment pegs 554 may be longer than the terminal posts 310a, 310b, and positioned to coordinate with alignment holes in the printed circuit board. Indeed, the printed circuit board may include alignment holes to coordinate with the alignment pegs 554 and through-hole mounting features to coordinate with the terminal posts 310a, 310b such that when the alignment pegs 554 placed into the respected alignment holes, then the terminal posts 310a, 310b also align with the respective through-hole mounting features. In various embodiments, the alignment pegs 554 may include a tapered end to facilitate alignment by directing the current measurement device into proper position during placement on the printed circuit board. Accordingly, the tapered portion may coordinate with the alignment holes so as to direct the terminal posts 310a, 310b to the through-hole contact features. During placement, the tapered portion of the alignment pegs 554 may come into contact with side walls of the alignment holes 906 of the printed circuit board. As the current measuring device continues to be pushed onto the printed circuit board, it is also directed into the correct position by the coordination of the alignment posts 554 and the alignment holes, resulting in proper alignment of the terminal posts 310a, 310b with their respective through-hole mounting features. In various embodiments, the terminal posts 310a, 310b may coordinate with surface traces or other surface-mount features of the printed circuit board instead of through-hole contacts.

In various embodiments, the current measuring device may include mounting feet 568 to contact the printed circuit board, and which may be configured to maintain a degree of separation between the current measuring device and the printed circuit board. Conveniently, the mounting feet 568 may be extensions or pockets formed from the guide couplers 562 of the housing base 552. The separation between the housing base 552 and the printed circuit board provided by the mounting feet 568 may allow for better heat dissipation, flow of board washing fluids, and flow of conformal coating materials. Various alignment pegs 554 and mounting feet 568 may further be configured to add structural strength to the joint between the current measuring device and the printed circuit board. The additional structural strength may reduce stress on the physical and electrical connections between the termination posts 310a, 310b and traces on the printed circuit board.

In various embodiments the housing cup 502 and housing base 552 may be formed from electrically insulating materials such as, for example, polymers, glass, paper, and the like. The housing cup 502 and housing base 552 may provide dielectric strength to electrically insulate between the windings and a conductor of a primary current to be measured. Accordingly, the housing cup 502 and housing base 552 may provide electrical insulation from the various other conductors that may be present such as, for example, traces on the printed circuit board, leads from various components in the IED 110, primary signal conductors (such as a primary staple illustrated hereafter), and the like. In various embodiments, the housing cup 502 and housing base 552 may be formed from the same material. In other embodiments, the housing cup 502 and housing base 552 may be formed from different materials. In one embodiment, the housing cup 502 and housing base 552 may be formed from a nylon polymer. In various embodiments, one or more of the housing cup 502 and housing base 552 may be formed from a glass-reinforced nylon polymer.

Figure 6:
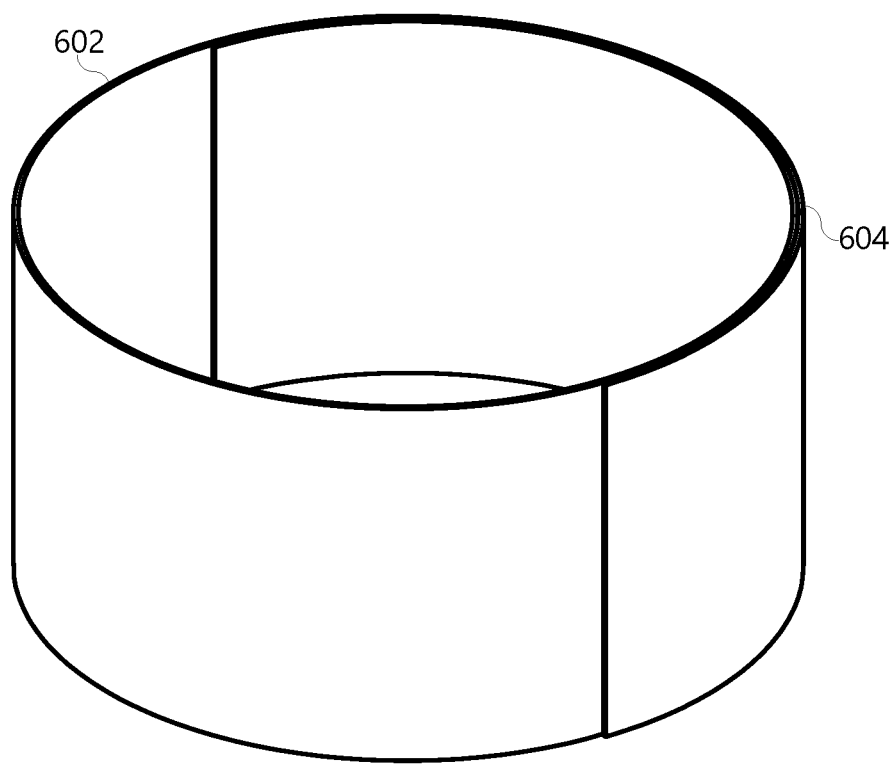
FIG. 6 illustrates a magnetic field shield of a current measuring device in accordance with several embodiments herein.

As has been discussed above, the current measuring device may include an electromagnetic shield. FIG. 6 illustrates a perspective view of an electromagnetic shield 602 in accordance with several embodiments. It has been observed that various components of a protective relay and the equipment near typical relay installations (for example, motors, generators, transformers, and the like) may produce stray electromagnetic fields. These electromagnetic fields may interfere with the measurements by current measuring devices used in protective relays. Accordingly, to improve the accuracy of the current measuring devices herein, an electromagnetic shield 602 may be used.

The shield 602 may be formed from a high permeability ferromagnetic material that can redirect magnetic fields away from the current measuring device. The material may include a metal such as iron, copper, brass, nickel, cobalt, silver, steel, tin, or the like. The material may be in the form of a metal sheet, metal screen, metal foam, or the like configured to be placed around the wound bobbin. In one particular embodiment, the shield 602 is formed from a metal sheet of electrical steel, which may be grain-oriented. In various embodiments the shield 602 may be shaped into a cylindrical form and heat-treated to retain the desired form and to restore the magnetic properties of the shield 602 material.

In various embodiments, the shield 602 may be formed in a generally circular shape with an overlapping section 604 that may be used for expanding and reducing the diameter of the shield 602. Accordingly, the shield 602 may be slightly expanded for placement around the configured bobbin 400, and then slightly contracted to the circumference of the configured bobbin 400. Both the configured bobbin 400 and the shield 602 may be placed within the housing 502, 552 to form the current measuring device.

Shield 602 may also be configured as an electrostatic shield (Faraday cage) which encompasses the wound bobbin 300 and is brought out of the housing 502, 552 allowing the shield to be connected to the signal processing circuit 130 common. In various embodiments, connection to such a common may reduce capacitive coupling to the primary conductor.

Figure 7:
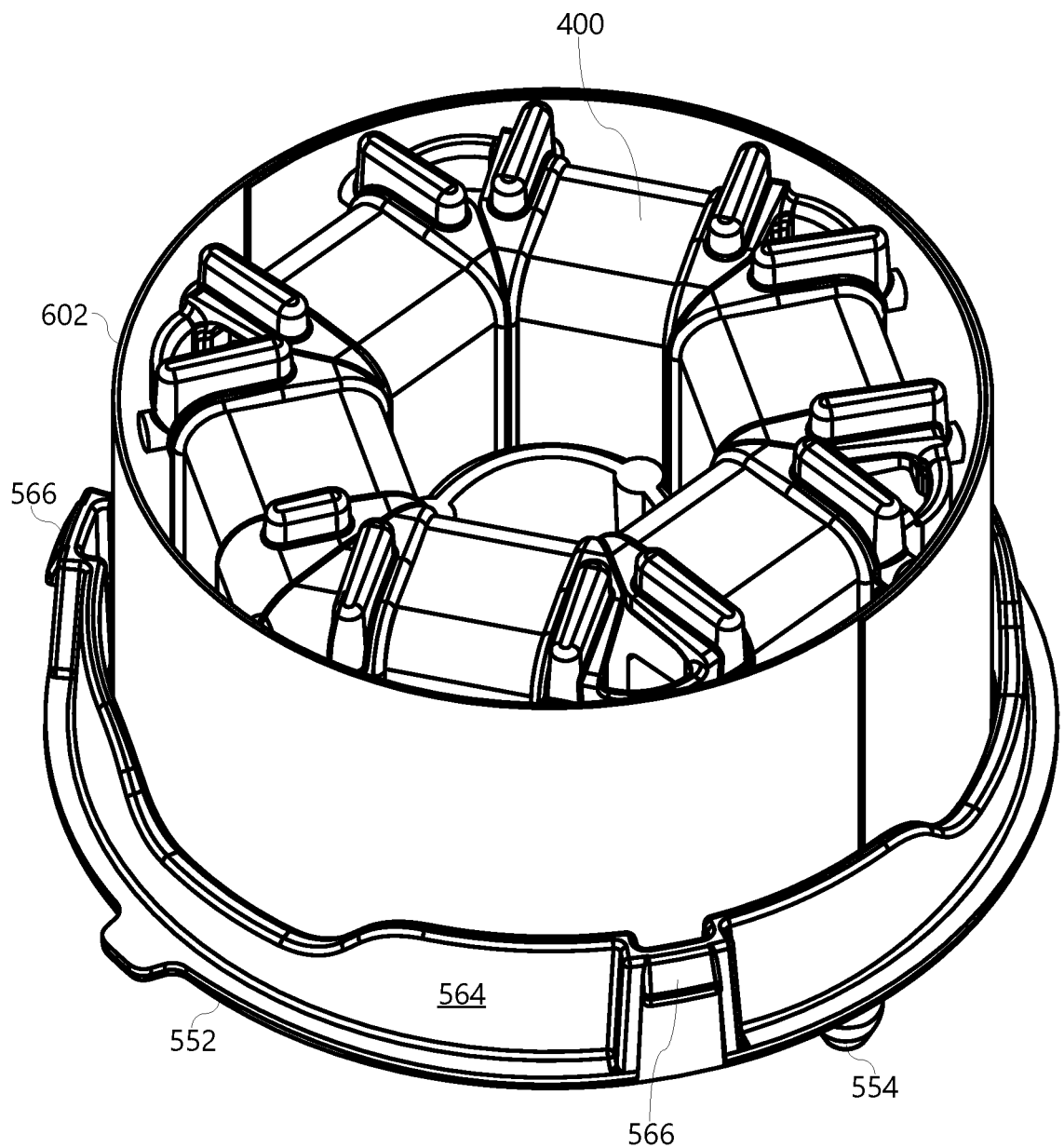
FIG. 7 illustrates a partially assembled current measuring device in accordance with several embodiments herein.

FIG. 7 illustrates the housing base 552 with the configured bobbin 400 and the shield 602 placed therein. The shield 602 is illustrated as partially within the contacting surface 564. In various embodiments, the contacting surface 564 may coordinate with the shield 602 to maintain the shape of the shield 602 or prohibit the shield 602 from expanding. The configured bobbin 400 is illustrated as positioned within the shield 602.

Figure 8:
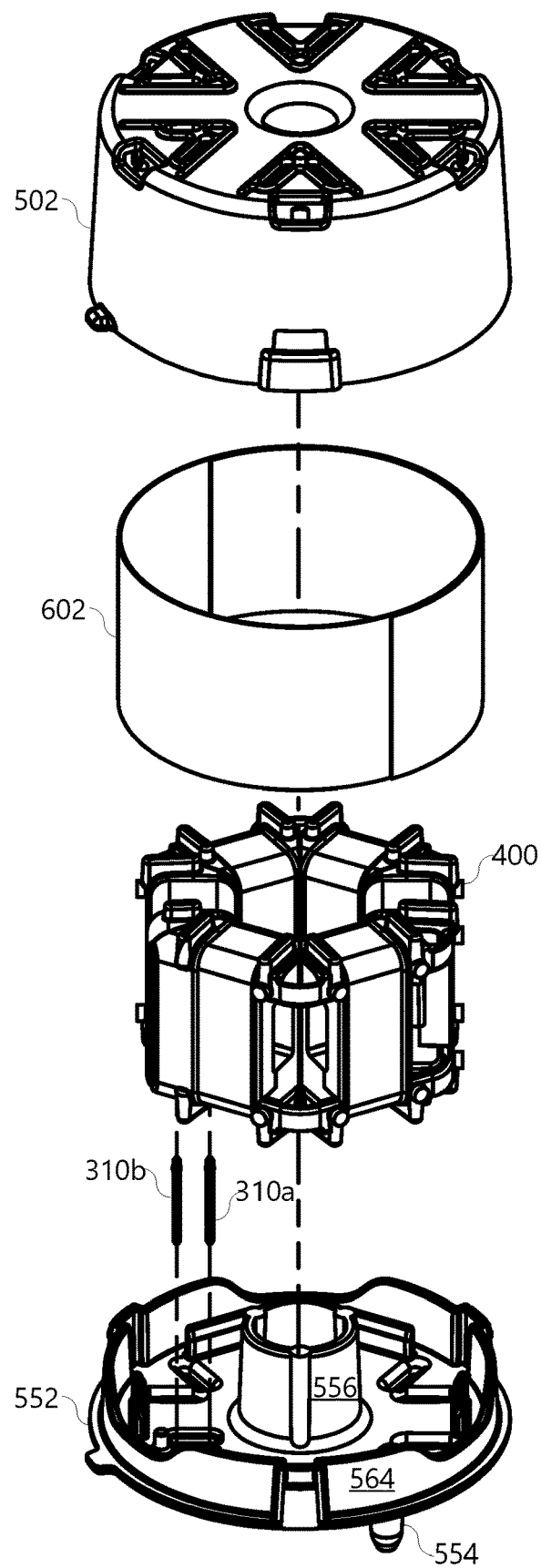
FIG. 8 illustrates an exploded view of a current measuring device in accordance with several embodiments herein.

FIG. 8 illustrates an exploded view of the current measuring device in accordance with several embodiments herein. The current measuring device generally includes a housing cup 502 and housing base 552 in which is assembled the configured bobbin 400 and electromagnetic shield 602. It should be noted that in various embodiments the current measuring devices in accordance with embodiments herein may not include an electromagnetic shield 602. Also illustrated are the termination posts 310a and 310b, which are shown to coordinate with an opening 560 in the housing base 552 such that the termination posts 310a 310b extend through the opening 560. In this manner, the termination posts 310a, 310b may be electrically connected with traces on a printed circuit board.

The configured bobbin 400 is illustrated as fitting over or around the conductor aperture 556. The conductor aperture 556 may extend partially or completely through the configured bobbin 400. The conductor aperture 556 may include portions that contact portions of the inner circumference of the configured bobbin 400 adding mechanical stability to the position of the configured bobbin 400 within the housing base.

The electromagnetic shield 602 may be placed around the outer circumference of the configured bobbin 400, between the configured bobbin 400 and the contacting surface 564 of the housing base 552. With the configured bobbin 400 and the electromagnetic shield 602 in place in the housing base 552, the housing cup 502 may be placed over the configured bobbin 400 and electromagnetic shield 602 to cooperate with the contacting surface 564 of the housing base 552 as has been described above.

Figure 9B:
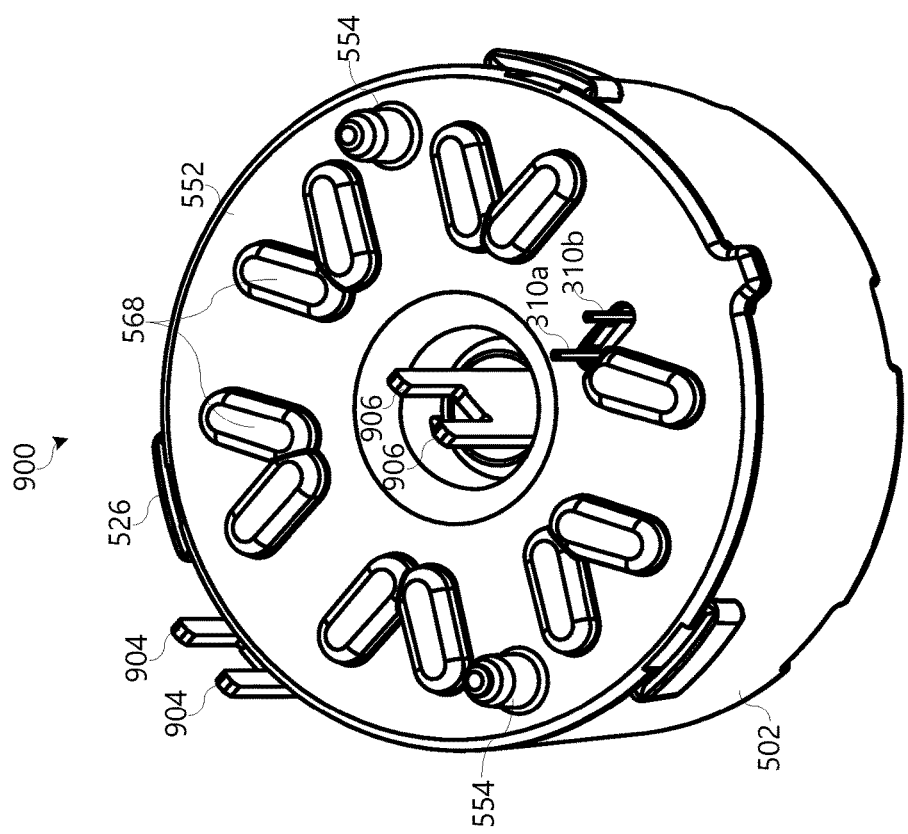
FIGS. 9A and 9B illustrate an assembled current measuring device in accordance with several embodiments herein.
Figure 9A:
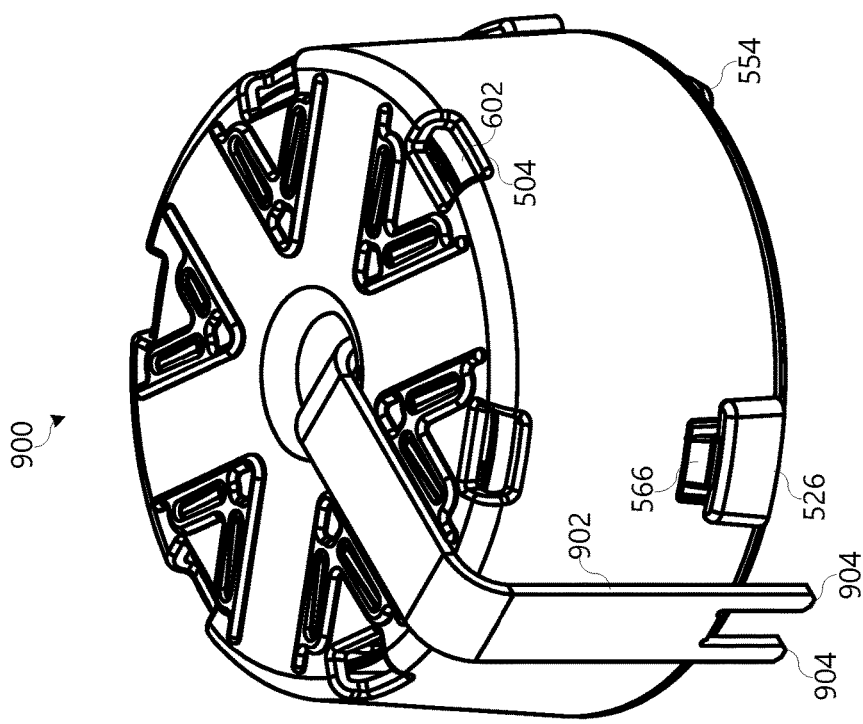

FIG. 9A illustrates a top perspective view of an assembled current measuring device 900 in accordance with several embodiments herein. The securing clip 566 of the housing base 552 can be seen in coordination with the clip receiver 526 of the housing cup 502. Furthermore, the electromagnetic shield 602 can be seen through the drain window 504, which allows for washing fluids to be removed from the current measuring device 900 after board washing.

FIG. 9B illustrates a bottom perspective view of the current measuring device 900. The termination posts 310a, 310b can be seen extending through the bottom of the housing base 552 for cooperation with electrical traces of a printed circuit board. The alignment pegs 554 are illustrated as extending from the housing base 552.

The assembled current measuring device 900 illustrated in FIGS. 9A and 9B may further include a conductor 902 that may carry a current signal to be measured. The conductor 902 may extend through the center opening of the current measuring device 900 such that current through the conductor 900 may induce a signal in the windings of the configured bobbin 400. The conductor 902 may include board contacts 904 and 906 for electrical connection with conductive traces of a printed circuit board or other conductors carrying the current to be measured. In various embodiments, the current measuring device may be configured for through-hole mounting on a printed circuit board, where each of the termination posts 310a, 310b and the conductor contacts 904, 906 may coordinate with predetermined conductive traces of a printed circuit board. In various embodiments, the current measuring device may be configured as a surface-mount device where each of the termination posts 310a, 310b and the conductor contacts 904, 906 may coordinate with predetermined conductive pads or traces of a printed circuit board. Combinations of through-hole and surface-mount contacts may be used in the current measuring device in accordance with several embodiments.

In various embodiments, the conductor 902 may be assembled as part of the current measuring device. In such embodiments, the conductor 902 may be attached to the housing cup 502 using adhesive, mechanical attachment including snaps, pressure fit, or the like.

In various embodiments, the conductor 902 may be assembled onto the configuration separately. For example, the conductor 902 may be placed on the current measuring device 900 after assembly of the current measuring device 900 onto a printed circuit board.

Figure 10:
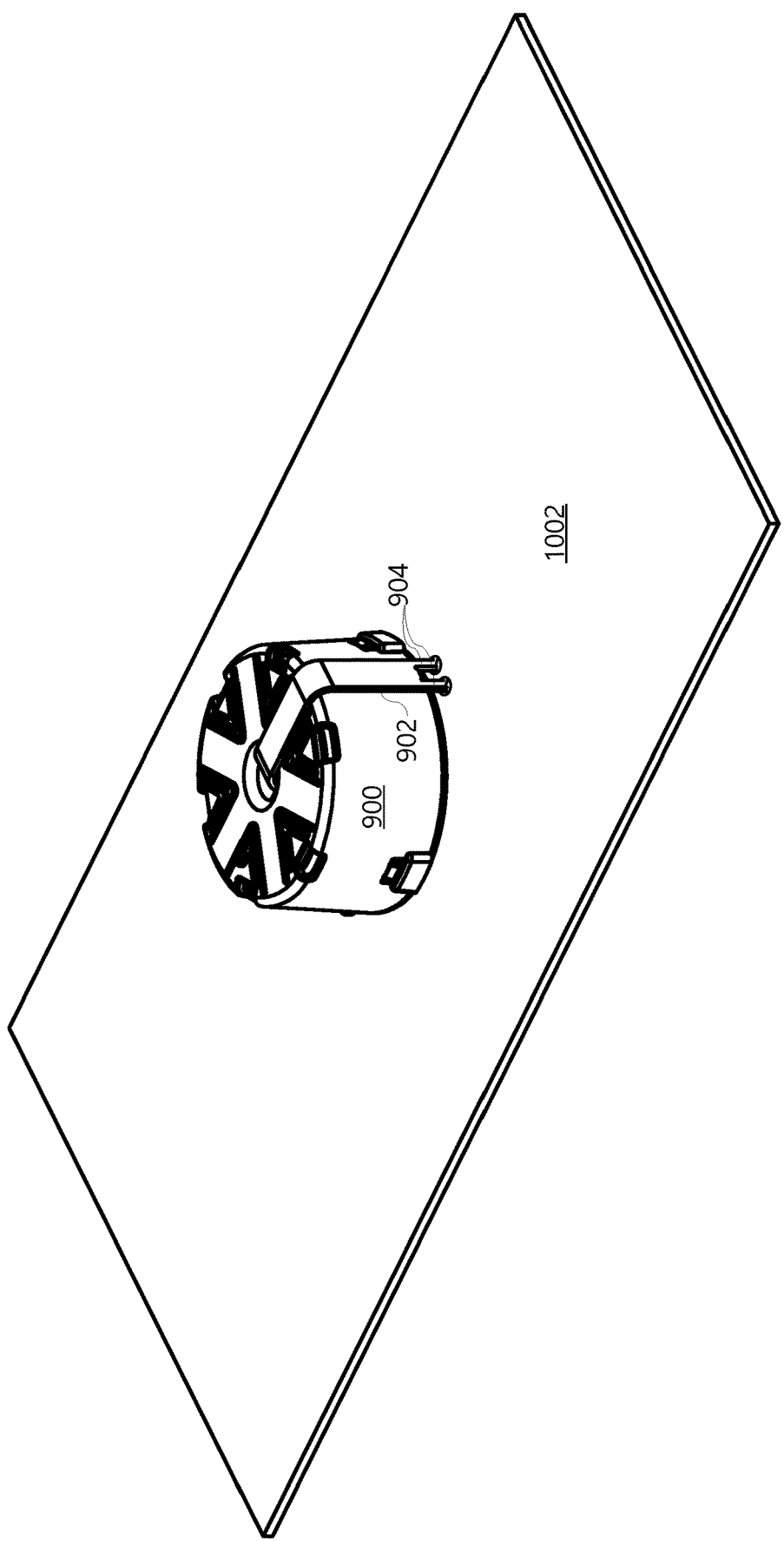
FIG. 10 illustrates a current measuring device mounted on a printed circuit board in accordance with several embodiments herein.

FIG. 10 illustrates a perspective view of an assembled current measuring device 900 as mounted on a printed circuit board 1002. In various embodiments, the printed circuit board 1002 may be part of or installed in an IED 110. The termination posts 310a, 310b (not separately illustrated) may be in electrical contact with predetermined traces of the printed circuit board 1002. Accordingly, signals from the bobbin windings 304 may be transmitted via the termination posts 310a, 310b to components of the IED 110 that use signals. For example, the signals may be conditioned, sampled, and transmitted to a processor 120 for use in determining equipment status and effecting a protective actions based on the equipment status. For example, a current in protected equipment may be determined using the signals and, when the current exceeds a predetermined threshold for a predetermined time, a signal to open a circuit breaker may be transmitted, tripping the equipment offline.

Similarly, the board contacts 904, 906 of the conductor 902 may be in electrical contact with predetermined traces of the printed circuit board 1002. In various alternative embodiments, the board contacts 904, 906 of the conductor 902 may be in contact with conductors that receive the current to be measured. In any of these embodiments, the current to be measured may be conducted to the conductor 902 from an external source.

As was indicated above, the printed circuit board 1002 may be placed in or part of an IED 110. The IED 110 may provide protection and/or monitoring of equipment such as electrical or industrial equipment. In various embodiments, such as is illustrated in FIG. 1, the IED 110 may provide protection and/or monitoring of equipment in an electrical power delivery system. Accordingly, the external current sources to be measured may be related to currents in electrical conductors, lines, buses, transformers, switches, reactors, generators, motors, or the like. The IED may include various other components.

Figure 11:
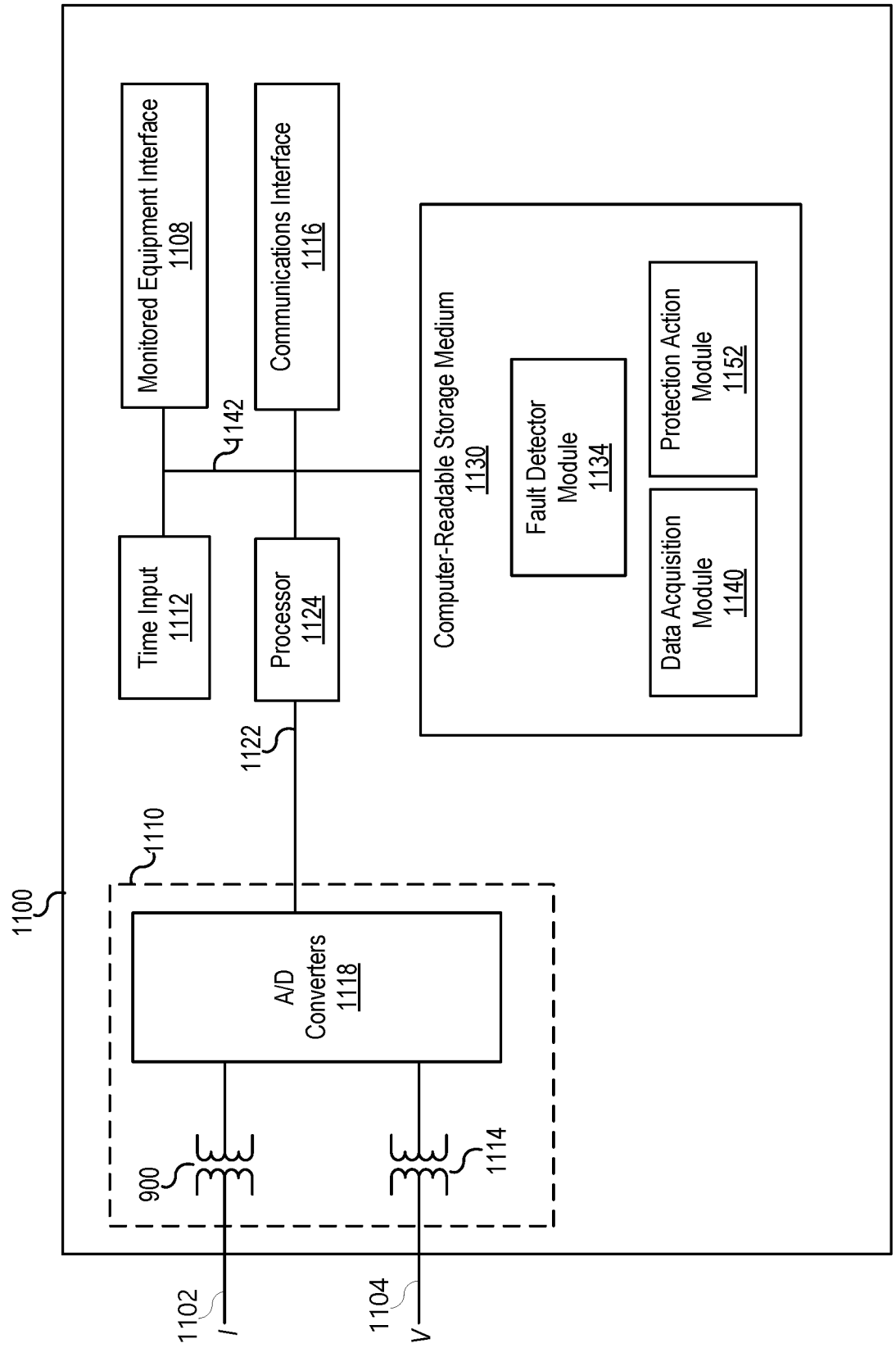
FIG. 11 illustrates a simplified block diagram of an electric power protection system incorporating a current measuring device in accordance with several embodiments herein.

FIG. 11 illustrates a simplified block diagram of an IED 1100 for providing protection and/or monitoring functions to equipment. The IED 1100 may include signal acquisition circuitry 1110 for acquiring signals from the monitored equipment. The IED may use such signals to determine a status of the monitored equipment, and for determining a protective action based on the status. The signal acquisition circuitry may include a current input 1102 for receiving signals related to the current through the monitored equipment and a voltage input 1104 for receiving signals related to the voltage of the monitored equipment. For example, if the monitored equipment is a distribution feeder 108, the current input 1102 may be in electrical communication with an output from current transformer of feeder 108 and the voltage input 1104 may be in electrical communication with an output of voltage transformer of bus 106. The current transformer may step down the current from the feeder 108 to a level acceptable for consumption by the IED 1100. In various other embodiments, additional external signal processing may be performed.

The voltage input 1104 may be in electrical communication with a transformer 1114 and other signal processing hardware to condition the signal for sampling (such as by an analog-to-digital converter, A/D 1118).

The current signal from 1102 may be conducted through the current measuring device 900 hereof. The current signal may be conducted through the signal conductor 902. The current induces a signal in the windings 304 of the measuring device 900, which signal may be further conditioned and sampled (such as by the A/D 1118). The sampled current and/or voltage signals from the signal acquisition circuitry 1110 may be available to processor 1124 via data bus 1122.

It should be noted that the signal acquisition circuitry 1110 may be embodied in hardware that may be mounted on one or more printed circuit boards of the IED 1100. Current input 1102 may be available to the signal acquisition circuitry 1110 by an electrical connection from the external sources to inputs on the IED 1100. Leads from the inputs may be in electrical communication with traces on the printed circuit board, which carry the signals to the current measuring device 900.

In various embodiments, the IED 1100 may be configured to monitor various pieces of equipment and/or receive inputs from multiple electrical phases, neutral, ground, and other sources. Accordingly, several current measuring devices 900 may be required to obtain current signals from the various sources. Previous current transformers using iron cores are relatively heavy. In order to obtain samples from multiple current sources, many current transformers were needed, adding to the weight of the printed circuit boards, and to the IED overall. One of the improvements of the present embodiments over the prior current transformers is the decreased weight of the current measuring device, which greatly reduces the weight of the printed circuit boards and the IED 900 overall. Furthermore, because of the reduced weight, the printed circuit board, mechanical connections, and the IED 900 overall may not need to be designed to support such weight. Accordingly, material costs, handling costs, shipping costs, and others may be reduced using the embodiments herein.

The processor 1124 may be embodied as a general-purpose integrated circuit, an application-specific integrated circuit, a field-programmable gate array, a microprocessor, and/or any other suitable programmable logic processing device. The processor may be packaged with and/or in communication with computer-readable storage media 1130 for storing information and/or reading information and instructions for operation.

In various embodiments, the IED 1100 may include a time input 1112 for receiving a common time signal. The common time signal may allow the IED to coordinate with various other devices. The time input may be received via communications interface 1116 or a separate interface.

The communications interface 1116 may facilitate direct communication with other IEDs or communicate with systems over a communications network. Communications interface 1116 may allow for protection and/or monitoring information to be sent to various other devices and systems. Furthermore, communications interface 1116 may facilitate communications to the IED 1100 from other devices.

The monitored equipment interface 1108 may receive status information from, and/or issue control instructions to, monitored equipment. In various embodiments, the monitored equipment may be a circuit breaker or other switching device. Using the monitored equipment interface 1108, the IED may obtain open/closed status of the circuit breaker. The IED may also send a trip protection signal to the circuit breaker using the monitored equipment interface 1108, thus effecting a protective tripping action.

The computer-readable storage medium 1130 may include various computer instructions for execution by the processor. For example, the computer-readable storage medium may include data acquisition module 1140 that includes instructions for using the current and/or voltage signals from the signal acquisition circuitry 1110. The data acquisition module 1140 may format and order the measurements into data useful for various other modules of the computer-readable storage medium 1130.

The computer-readable storage medium 1130 may further include a fault detector module 1134. The fault detector module 1134 may use the data from the data acquisition module 1140 to determine a state of the monitored equipment. For example, the fault detector module 1134 may determine whether a fault has occurred on the monitored equipment using the current and/or voltage data. Various types of protection elements may be performed using the fault detector module, such as, for example, overcurrent, negative-sequence overcurrent, phase overcurrent, inverse-time overcurrent, undervoltage, overvoltage, loss of potential, directional power, power factor, overfrequency, underfrequency, or the like. Upon determining a fault condition, the fault detector module 1134 may issue a fault signal.

The computer-readable storage medium 1130 may further include a protection action module 1152. The protection action module 1152 may determine a protective action to issue in response to a state determination from the fault detection module 1134. In various embodiments, the protection action module 1152 may cause the IED 1100 to issue a trip command to a circuit breaker to remove electric power from the monitored equipment. The trip command may be sent to the circuit breaker via the monitored equipment interface 1108. The protection action module 1152 may determine other protective actions responsive to the determined state of the monitored equipment, such as, for example, sending a trip command to another protective device via the communications interface 1116, sending a communication to a supervisory control and data acquisition (SCADA) system or other supervisory system, sending a communication to an operator, signaling equipment to operate, and the like.

As has been described, an IED may take protective or other actions upon a determination of the status of monitored equipment. The status of the monitored equipment may be determined using signals acquired using a current measuring device 900. In order to make a proper determination of equipment status and take an appropriate protective action, the current measuring device should provide accurate signals. To that end, the current measuring device should provide reliable signals across a wide range of input currents. The current measuring device should provide reliable signals even in the presence of stray electromagnetic fields. The current measuring device embodiments described herein provide reliable signals across a wide range of current inputs, even in the presence of stray electromagnetic fields.

While specific embodiments and applications of the disclosure have been illustrated and described, it is to be understood that the disclosure is not limited to the precise configurations and components disclosed herein. Moreover, principles described herein may also be used for current measurement devices that are not configured to be mounted on printed circuit boards. Accordingly, many changes may be made to the details of the above-described embodiments without departing from the underlying principles of this disclosure. The scope of the present invention should, therefore, be determined only by the following claims.

What is claimed is:

1. A current measurement device for mounting on a circuit board, comprising:
    a flexible core configurable between open and closed configurations, the flexible core including:
        a plurality of winding sections; and,
        a plurality of housing guides extending in a first direction from the core;
    a winding supported on the flexible core;
    a first and second terminal in electrical connection with ends of the winding for electrical connection with traces on the circuit board, the first and second terminal extending from the core in the first direction; and,
    a housing for the flexible core, the housing formed to contain the flexible core in closed configuration, the housing including:
        a terminal opening for extension of the first and second terminals through the housing;
        a plurality of guide couplers for cooperation with the plurality of housing guides of the flexible core.

2. The current measurement device of claim 1, wherein a plane of the housing includes the guide couplers and the terminal opening.

3. The current measurement device of claim 1, wherein the housing comprises a housing base and a housing cup.

4. The current measurement device of claim 3, wherein the housing base comprises the terminal opening and the guide couplers.

5. The current measurement device of claim 4, wherein:
    the plurality of housing guides of the flexible core comprises housing guides extending in the first direction from the core and housing guides extending in a second direction from the core; and
    the housing cup comprises a second plurality of guide couplers for cooperation with the plurality of housing guides extending in the second direction from the flexible core.

6. The current measurement device of claim 5, wherein coordination of the plurality of housing guides and the plurality of guide couplers resist rotation between the housing and the flexible core.

7. The current measurement device of claim 5, wherein the guide couplers comprise openings in the housing, and coordination of the plurality of housing guides and the plurality of guide couplers comprises extension of portions of the housing guides through the guide couplers.

8. The current measurement device of claim 3, wherein the housing base comprises a plurality of securing clips and the housing cup comprises a plurality of clip receivers.

9. The current measurement device of claim 3, wherein the housing base further comprises a contacting surface for contacting the housing cup, and wherein the plurality of securing clips are formed into the contacting surface.

10. The current measurement device of claim 1, wherein the housing comprises a conductor aperture.

11. The current measurement device of claim 1, further comprising a conductor disposed outside of the housing configured to conduct the electrical signal to be measured by the current measurement device.

12. The current measurement device of claim 1, wherein the housing comprises a drain window configured to allow passage of a washing fluid from the housing.

13. The current measurement device of claim 1, further comprising an electromagnetic shield surrounding a circumference of the flexible core in a closed configuration.

14. The current measurement device of claim 13, wherein the electromagnetic shield is disposed between the flexible core and the housing.

15. The current measurement device of claim 13, wherein the electromagnetic shield is expandable.

16. The current measurement device of claim 1, wherein the flexible core comprises a hollow core.

17. The current measurement device of claim 1, wherein the housing further comprises an alignment peg configured to align the current measurement device with the circuit board.

18. A current measurement device for mounting on a circuit board comprising:
    a hollow core, the hollow core including:
        a first plurality of housing guides extending in a first direction from the core; and,
        a second plurality of housing guides extending in a second direction from the core;
    a winding supported on the hollow core;
    a first and second terminal in electrical connection with ends of the winding for electrical connection with traces on the circuit board; and,
    a housing for the hollow core, the housing formed to contain the hollow core, the housing including:
        a terminal opening for extension of the first and second terminals through the housing;
        a first plurality of guide couplers for cooperation with the first plurality of housing guides of the flexible core; and,
        a second plurality of guide couplers for cooperation with the second plurality of housing guides of the flexible core.

19. The current measurement device of claim 18, wherein the cooperation of the first plurality of guide couplers and the first plurality of housing guides resist rotation between the housing and the hollow core.

20. The current measuring device of claim 18, wherein the housing comprises a housing base and a housing cup.

* * * * *